United States Patent [19]

Tippetts

[11] 4,043,485
[45] Aug. 23, 1977

[54] MAGAZINE FOR A PLURALITY OF FIXTURES HOLDING INTEGRATED CIRCUIT CHIPS

[75] Inventor: Kenneth Boyd Tippetts, Glendale, Ariz.

[73] Assignee: Honeywell Information Systems, Inc., Phoenix, Ariz.

[21] Appl. No.: 712,564

[22] Filed: Aug. 9, 1976

[51] Int. Cl.² .............................................. B65G 1/08
[52] U.S. Cl. .................................. 221/312 R; 312/60
[58] Field of Search .................... 221/232, 312 R, 268, 221/261, 197, 198, 93, 152; 312/60, 61, 35, 184, 214

[56] References Cited

U.S. PATENT DOCUMENTS

| 2,990,084 | 6/1961 | Probasco | 221/152 X |
| 3,393,831 | 7/1968 | Stewart | 221/232 |

*Primary Examiner*—Stanley H. Tollberg
*Assistant Examiner*—Hadd S. Lane
*Attorney, Agent, or Firm*—Edward W. Hughes; William W. Holloway, Jr.

[57] ABSTRACT

A magazine into which a plurality of fixtures holding integrated circuit chips can be inserted serially by a machine and from which the fixtures can be removed serially by a machine. The fixtures are loaded through an opening in the bottom of the magazine and are removed from the magazine through the same opening. The magazine provides protection to the fixtures and chips held by the fixtures during storage and handling encountered in the typical manufacturing environment for electronic systems. The magazine facilitates automating the processes of accumulating fixtures holding integrated circuits of a given type and of assembling in one magazine the desired number of fixtures holding integrated circuit chips of the appropriate types preparatory to mounting the chips on a multilayer substrate.

8 Claims, 6 Drawing Figures

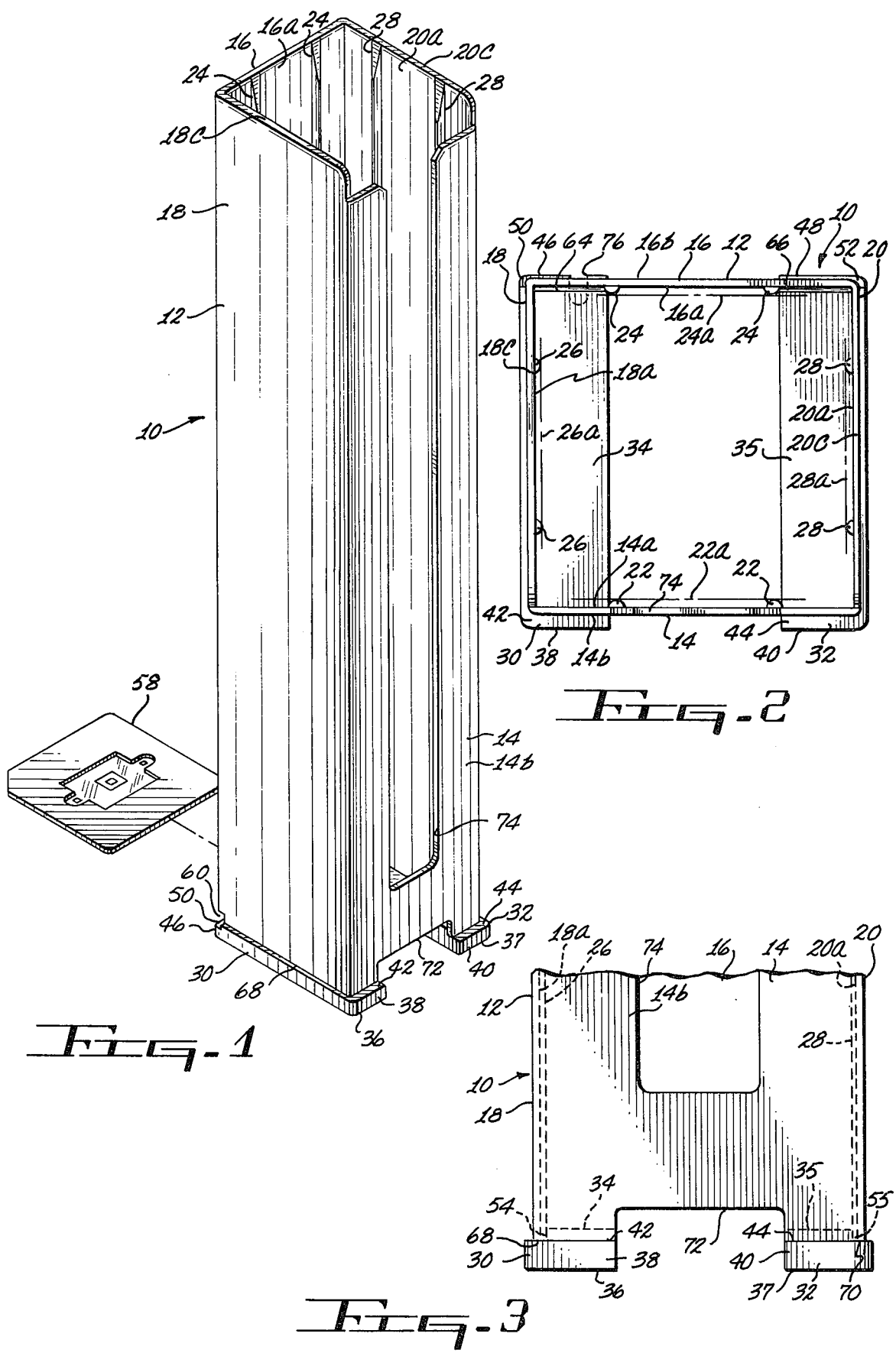

MAGAZINE FOR A PLURALITY OF FIXTURES HOLDING INTEGRATED CIRCUIT CHIPS

CROSS REFERENCES TO RELATED APPLICATIONS

A. A fixture adapted to hold an integrated circuit chip mounted on a flexible beam lead is described and claimed in Application Ser. No. 671,238 filed Mar. 29, 1976 entitled Fixture for an Integrated Circuit Chip, now U.S. Pat. No. 4,007,479 issued Feb. 8, 1977, which patent is assigned to the same assignee as this invention.

B. A mechanism for serially removing fixtures stored in one magazine of this invention and for inserting the removed fixture into another such magazine is described and claimed in application Ser. No. 712,565 filed Aug. 9, 1976, entitled Transfer Mechanism by K. Boyd Tippetts and assigned to the assignee of this invention.

C. A machine for assembling into a magazine of this invention a plurality of fixtures holding integrated circuit chips of the proper type and in the correct number from a plurality of such magazines is described and claimed in application Ser. No. 712,563 filed Aug. 9, 1976, entitled Sequencer by K. Boyd Tippetts and John L. Kowalski and assigned to the assignee of this application.

BACKGROUND OF THE INVENTION

This invention is in the field of magazines for receiving, storing and supplying fixtures. The magazines are adapted to be mounted on a machine which can serially extract fixtures stored in one magazine through an opening in the bottom of the device through which fixtures can be inserted, and can insert serially such fixtures into a second such magazine through an equivalent opening in the bottom of the second magazine so that a plurality of such fixtures can be accumulated in a second such magazine. These magazines, after fixtures have been inserted into them and while fixtures are stored within them, protect the fixtures, and the devices mounted on the fixtures during subsequent manufacturing steps. The magazines readily facilitate automating the removal of fixtures stored in them by appropriate machines as part of the process of manufacturing electronic circuits, such as are used in computers.

DESCRIPTION OF THE PRIOR ART

The development of integrated circuit (IC) chips, particularly medium and large scale IC chips, has created a need for improved manufacturing processes which lend themselves to automating the mounting of IC chips and their lead frames to substrates as part of the process of manufacturing electrical circuits. The mounting of such a chip and its lead frame in a fixture for testing and to facilitate mounting chips on a substrate is known. However, in automating the process of manufacturing such substrates, it is desirable to assemble a plurality of fixtures into a holder or magazine which magazine has a capability of having such fixtures inserted into the magazine by machine and subsequently removed by a machine as steps in the process of manufacturing electrical circuits which are characterized by a high density of active electrical elements per unit area and are particularly suitable for use in computers and the like.

The closest known relevant prior art is that which has been developed with respect to holders, or magazines, for film slides, i.e., fixtures for holding segments of developed photographic film for use with a projector to project an enlarged image onto a screen, for example. However, none of the prior art magazines are adapted to be serially bottom loaded by a machine and serially unloaded by a machine from the bottom.

SUMMARY OF THE INVENTION

The present invention provides a magazine for a plurality of fixtures. It is formed from a hollow tube having four walls the inner surfaces of which are substantially planar. A pair of ribs are formed on the inner surface of each of the walls and the cross sectional area of the space defined by the ribs is such that fixtures readily fit within it and can be moved vertically in the magazine without binding or encountering large frictional forces. The bottom of the magazine is comprised of a pair of rails which are spaced apart to form an opening providing access to the space within the tube while supporting or retaining within the magazine fixtures previously loaded into it. An opening is formed in one of the walls of the tube immediately above the rails. It is through this opening that fixtures can be inserted one at a time or serially. This opening extends across the full width of the wall and its height is such that one and only one fixture can be inserted at a time into the magazine. Similarly, one and only one fixture can be withdrawn through this opening at a time. Another opening is formed in the opposite wall of the magazine so that an extractor can contact the lowest fixture stored in the magazine, the fixture in direct contact with the rails, for removal of the fixture from the magazine through the opening in which it was inserted. The rails are secured to the bottom of some of the walls of the rectangular hollow tube and are shaped so that portions serve as ledges which facilitate removably mounting the magazines of this invention on suitable machines for loading and unloading.

BRIEF DESCRIPTION OF THE DRAWINGS

Other objects, features and advantages of the invention will be readily apparent from the following description of a preferred embodiment thereof taken in conjunction with the accompanying drawings, although variations and modifications may be affected without departing from the spirit and scope of novel concepts of the disclosure, and in which:

FIG. 1 is an isometric view of a magazine having exploded therefrom a fixture of the type the magazine is adapted to have loaded into it, stored in it and removed from it;

FIG. 2 is an enlarged plan view of the magazine;

FIG. 3 is an enlarged fragmentary rear elevation of the lower portion of the back wall of the magazine;

DESCRIPTION OF THE PREFERRED EMBODIMENT

Figure 4:
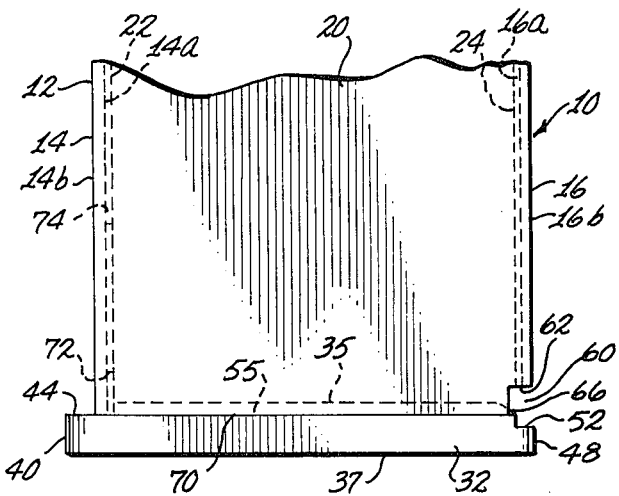
FIG. 4 is an enlarged fragmentary elevation of the lower portion of a side wall of the magazine.
Figure 5:
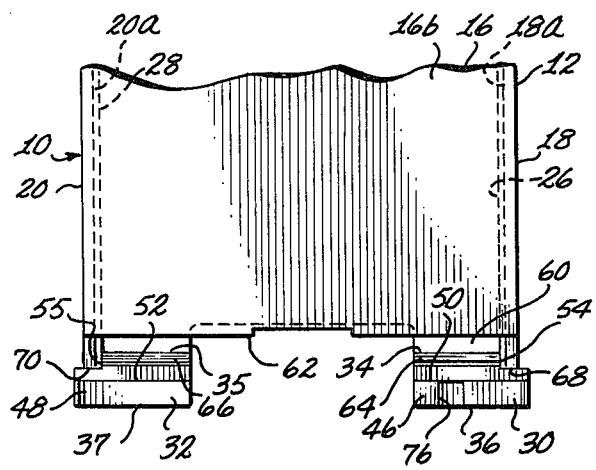
FIG. 5 is an enlarged fragmentary elevation of the lower portion of the front wall of the magazine.

Magazine, or holder, 10 includes a hollow rectangular tube 12 as can be seen in FIGS. 1 and 2. Tube 12 has a back wall 14, a front wall 16 and a pair of side walls 18, 20. The inner surfaces or faces 14a, 16a, 18a and 20a of walls 14, 16, 18 and 20, are substantially planar.

On each of the inner surfaces 14a, 16a, 18a and 20a of walls 14, 16, 18 and 20, there are formed a pair of ribs, with a pair of ribs 22 being formed on surface 14a, a pair of ribs 24 being formed on 16a, ribs 26 on 18a, and ribs 28 on 20a. The ribs of each pair of ribs 22, 24, 26, 28, are substantially parallel to one another and are parallel to the intersections of the inner surfaces 14a, 16a, 18a and 20a of walls 14, 16, 18 and 20. The cross section of each of the ribs forming rib pairs 22, 24, 26, 28 is substantially that of a segment of a circle as illustrated in FIG. 2.

A pair of rails 30, 32 is fixedly attached to side walls 18, 20 of tube 12. The rails in one embodiment are secured to the bottom surface of side walls 18, 20 and to lower portions of back wall 14 of tube 12. The top surfaces 34, 35 and bottom surfaces 36, 37 of rails 30, 32 are substantially planar and parallel to one another. Rails 30, 32 are mounted on tube 12 so that they are parallel to one another, are spaced apart, and so that their top surfaces 34, 35 substantially lie in a plane perpendicular to the inner surfaces 14a, 16a, 18a, 20a of walls 14, 16, 18, 20. The rear portions or ends, 38, 40 of rails 30, 32 extend or project beyond the outer surface 14b of back wall 14 to form rear ledges 42, 44. The front portions or ends 46, 48 of rails 30, 32 extend beyond the inner surface 16a of front wall 16 and substantially terminate in the plane of the outer surface 16b of front wall 16 as can best be seen in FIG. 4. The upper corners of the front ends 46, 48 of rails 30, 32 are removed to form steps 50, 52. External grooves 54, 55 are formed around the outer surfaces of rails 30, 32 to increase the area of contact between rails 30, 32 and side walls 18, 20 and back wall 14, to more securely attach rails 30, 32 to tube 12 particularly when both tube 12 and the rails 30, 32 are formed from separate pieces of metal.

Figure 6:
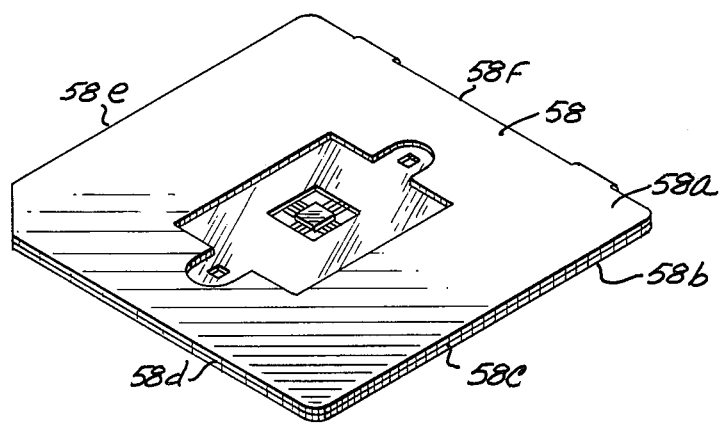
FIG. 6 is an isometric view of a fixture of the type that the magazine is adapted to have inserted into it, stored in it and subsequently removed therefrom.

The planes defined by the top surfaces 18c, 20c of side walls 18, 20, the top surfaces 34, 35 of rails 30, 32 and the rib planes 22a, 24a, 26a, 28a which are substantially tangent to ribs 22, 24, 26 and 28 define a space or volume within tube 12 which is a rectangular parallelepiped. A plurality, up to 200 in a preferred embodiment, of fixtures 58, of the type described and claimed in the application referred to in paragraph A of the list of cross referenced applications supra, can be stacked in this space in tube 12. In FIG. 6 it can be seen that the major outer surface of fixtures 58 such as top surface 58a, bottom surface 58b, and vertical surfaces 58c, d, e and f also form, or define, a rectangular parallelepiped. The height of the rectangular parallelepiped defined by fixture 58 is the distance between top surface 58a and bottom surface 58b.

In front wall 16, a rectangular loading and unloading slot, or opening 60, is formed. The width of slot 60 is substantially equal to the width of front wall 16 so that slot 60 extends completely across front wall 16. The clearance, or height of opening 60 between the bottom edge 62 of wall 16 and the top surfaces 34, 35 of rails 30, 32 is at least equal to the height of fixture 58 and less than twice the height of fixture 58. Opening 60 thus permits a plurality of fixtures 58 to be either loaded into or removed from magazine 10 through slot 60 one at a time. To facilitate the insertion of a fixture 58 into slot 60, the upper corners 64, 66 of rails 30, 32, which extend above the bottom edges 68, 70 of side walls 18, 20 are beveled, or champfered, as can be seen in FIG. 4.

An extractor slot 72 is formed in back wall 14. It has a rectangular cross section with its width being substantially equal to the distance between rails 30, 32 as can be seen in FIG. 3 and its height being, at a minimum, just enough to permit a mechanical extractor, which is not illustrated, to reliably engage a vertical surface such as surface 58e of fixture 58. The maximum height of the extractor slot 72 is not critical.

A hand loading slot 74 can be formed in one of the walls 14, 16, 18 or 20 of tube 12. In the preferred embodiment slot 74 is formed in the upper part of back wall 14. The width of slot 72 is less than the distance between ribs 22 formed on the inner surface 14a of back wall 14, and slot 72 extends from the top of wall 14 a substantial part of the length or height of wall 14, which corresponds to the height of hollow tube 10 as can be seen in FIG. 1. Enough of wall 14 is retained above extractor slot 72 to make certain that tube 12 has sufficient rigidity to protect fixtures 58 stored within it from physical damage. Hand loading slot 74 is a convenience that permits fixtures 58 to be hand loaded into or removed from the top of magazine 10. To minimize the risk of the fixtures catching on the upper portion of ribs 22, 24, 26 and 28, they are beveled as can best be seen in FIG. 1.

The top of magazine 10 as illustrated is not covered. It can be covered if an opening at the top of wall 14 is provided which is big enough so that the loading and unloading by hand of a reasonable number of fixtures 58, at one time can readily be accomplished. The pair of rails 30, 32 and their bottom surfaces 36, 37 provide a stable base for magazine 10 so that it is feasible to stand magazines 10 vertically on a substantially flat surface. Ledges 42, 44 on the back portions of the rail 30, 32 and steps 50, 52 formed in the front portions of rails 30, 32 make it possible to removably fasten magazine 10 on a fixture or machine while still permitting ready access to slot or opening 60 so that fixtures 58 can be inserted serially into magazine 10 through opening 60 or removed serially from magazine 10 through opening 60.

In a preferred embodiment, fixture 58 has a substantially square top surface 58a, and the cross section of the parallelpiped defined by the rib planes 22a, 24a, 26a, 28a is likewise square and is dimensioned so that a plurality of fixtures 58 will easily fit, or can be stacked, within it. The clearance between the outer surfaces 58c, d, e, and f of fixture 58 and ribs 22, 24, 26 and 28 in a preferred example is substantially $40.0 \times 10^{-3}$ inches. Ribs 22, 24, 26, 28 also make it possible for fixtures 58 to be readily inserted into magazine 10 even if partially misaligned. Further, the clearance between the ribs and a stack of fixtures 58 located within magazine readily permits movement of fixtures 58 vertically within tube 12 of magazine 10.

Ribs 22, 24, 26, 28 also reduce the friction between a stack of fixtures 34 in magazine 10 and the interior of the tubular portion 12 so that movement of a stack of fixtures 58 within magazine 10 as magazine 10 is loaded and unloaded is not prevented by fixtures 58 becoming immovably bound or locked within magazines 10. Extractor slot 72 is made sufficiently wide to facilitate a mechanical extractor engaging the lowest fixture 58 of a stack of fixtures 58 located within the magazine 10. A key slot 76 is formed in the front portion 46 of rail 30 so that the orientation of the magazine is readily determined.

In a preferred embodiment the internal dimensions of tube 12 is $2 \times 2 \times 12.5$ inches and tube 12 is preferably made out of extruded aluminum. Rails 30, 32 are also preferably made out of aluminum and are brazed to the tube 12 to form magazine 10. It is readily apparent that the magazine can be made from structural plastics such as a polycarbonate or an acetal resin, marketed under the names Lexon and Delrin respectively.

From the foregoing it is believed clear that the magazine of my invention is capable of having fixtures, which fixtures are adapted to hold a segment of film on which an integrated circuit chip is mounted loaded into and unloaded from it; and to protect such fixtures from damage in the typical industrial environment found in a facility for manufacturing complex electronic devices.

It should be obvious that various modifications can be made to my invention as disclosed herein without departing from the scope of the present invention.

What is claimed is:

1. A magazine for a plurality of fixtures, each fixture being adapted to hold a segment of a film strip having a lead frame attached to the segment and an integrated circuit chip bonded to the lead frame, the outer surfaces of each fixture substantially defining congruent rectangular parallelipipeds, the distance between the top and bottom faces of said parallelipipeds being the height of the fixtures and the top faces of the parallelipipeds being rectangular, said magazine comprising:
   a hollow tube having a front wall, a back wall and a pair of side walls, each of said walls having a substantially planar inner face, each wall having a length and a width;
   a pair of ribs formed on the inner faces of each wall of the tube, said ribs being substantially parallel to the intersections of the inner faces of the walls of the tube, said ribs being spaced apart and the cross section of the ribs being substantially a segment of a circle;
   the cross sectional area of the space defined by planes substantially tangent to the surfaces of the ribs being slightly greater than the area of the top face of a fixture so that a fixture loosely fits within said space;
   a pair of rails having substantially planar and parallel upper and lower faces; the width of each rail being substantially less than one half of the width of the front wall and the length of each rail being greater than the length of a side wall; each of said rails having a front end and a back end; one of said rails being fixedly secured to one side wall and a portion of the back wall and the other of said rails being fixedly secured to the other side wall and another portion of the back wall so that the rails are substantially parallel to each other, so that they are uniformly spaced from each other, so that the back end of each rail projects beyond the back wall to form a pair of back ledges, and so that the front end of each rail extends beyond the inner surface of the front wall;
   means forming an opening in the front wall, the minimum height of the opening measured from the upper faces of the rails being greater than the height of a fixture, the maximum height of the opening being less than twice the height of a fixture, and the width of the opening being substantially the complete width of the front wall;
   means forming an opening in the back wall, the minimum height of the opening measured from the upper faces of the rails being at least a substantial portion of the height of a fixture and its width being substantially equal to the distance between the rails;
   the front portion of the rails having means forming a step, the projecting portion of the step constituting front ledges; and
   means forming a key slot in one of the front ledges.

2. A magazine for a plurality of fixtures, each of the fixtures having a plurality of outer surfaces; one of the surfaces being a top surface and another being a bottom surface; the outer surfaces of each fixture substantially defining a first rectangular parallelipiped; the distance between the top and bottom surfaces being the height of the fixture; said magazine comprising:
   a hollow tube having a front wall, a back wall, and a pair of side walls; each of said walls having a width, a height and inner, outer, top and bottom surfaces, the inner surfaces being substantially planar;
   a pair of ribs formed on the inner surfaces of each of said walls, the part of each rib remote from the inner surface defining a rib plane;
   a pair of rails; each rail having substantially planar upper and lower surfaces which surfaces are substantially parallel to one another; the width of the rails being substantially less than one half the width of the outer surfaces of the front and rear walls, and the length of the rails being slightly greater than the width of a side wall; each rail having a front end portion and a back end portion; one of said rails being fixedly secured to the bottom of one of the side walls and a portion of the back wall and the other of said rails being fixedly secured to the bottom of the other side wall and to a portion of the back wall so that the rails are substantially parallel to one another, are spaced apart, and the top and bottom surfaces of the rails are substantially parallel to one another and lie in the same planes; the back end portion of each of the rails projecting beyond the outer surfaces of the back wall substantially an equal distance to form a pair of back ledges and the front end portion of each rail terminating substantially in the plane determined by the outer surface of the front wall of the hollow tube;
   the rib planes and a plane determined by the top surfaces of the side walls and the top surfaces of the rails defining a second substantially rectangular parallelipiped, the distance between the planes determined by the top surfaces of the side wall and the top surfaces of the rails being the height of the second parallelipiped, the cross sectional area of the second parallelipiped being slightly greater than the cross sectional area of the top surface of a fixture and the height of the second parallelipiped being such that a plurality of such fixtures can be stacked one on top of the other within the hollow tubular member,
   means forming a step in the upper part of the front end portion of the rails, the protruding portion of each step of each rail being a front ledge,
   means forming an opening in the front wall, the width of the opening substantially equaling the width of the front wall and the height of the opening measured from the top surfaces of the rails being at least equal to the height of a fixture and less than twice the height of a fixture, and
   means forming an opening in the back wall, the width of the opening being substantially equal to the distance between the rails and the height of the opening measured from the top surface of the rails being such that it is at least equal to a substantial portion of the height of a fixture.

3. A magazine as defined in claim 2 in which there are means forming a hand loading slot in the back wall.

4. A magazine as defined in claim 3 in which there are means forming a key slot in the front end portion of one of the rails.

5. A magazine as defined in claim 4 in which the hollow tube and the rails are formed of aluminum.

6. A magazine for a plurality of fixtures, each of the fixtures having a plurality of outer surfaces, one of the surfaces being a top surface, and another being a bottom surface, the outer surfaces of each fixture substantially defining a first rectangular parallelpiped, the distance between the top and bottom surfaces being the height of the fixture, said magazine comprising:

a hollow tube having a front, a back and a pair of side rectangular walls each of said walls having a width, a height, and each having inner, outer, top and bottom surfaces; the inner surfaces of the walls being substantially planar;

a pair of parallel ribs formed on the inner surfaces of each of said walls and extending substantially from the top surface to the bottom surface of each wall, said ribs defining a rib plane spaced from and substantially parallel to the inner surface of each wall, a pair of rails, each rail having substantially planar upper and lower surfaces which surfaces are substantially parallel to one another, the width of the rails being substantially less than one half the width of the front and rear walls and the length of each rail being slightly greater than the width of a side wall, each rail having a front end and a back end, one of said rails being fixedly secured to one side wall and to a portion of the back wall and the other of said rails being fixedly secured to the other side wall and to another portion of the back wall, so that the rails are substantially parallel to one another and spaced apart, the top and bottom surfaces of the rails being substantially parallel to one another and substantially lying in the same plane, the back end of each of the rails projecting beyond the outer surface of the back wall substantially an equal distance to form a pair of back ledges, the front end portion of each rail terminating substantially at the outer surface of the front wall of the hollow tube, the rib planes and a plane determined by the top surfaces of the walls of said tubes and the upper surfaces of the rails defining a second substantially rectangular parallelpiped, the distance between the planes determined by the top surfaces of the walls and the upper surfaces of the rails being the height of the second parallelpiped, the cross sectional area of the second parallelpiped being slightly greater than the cross sectional area of the top surface of a fixture and the height of the second parallelpiped being such that a plurality of such fixtures can be stacked on one another within the hollow tubular member, means forming a step in the upper part of the front end of the rails, the part of the front end of each rail remaining being a front ledge, means forming an opening at the bottom of the front wall the width of the opening substantially equaling the width of the front wall and the height of the opening measured from the top surfaces of the rails being at least equal to the height of a fixture and less than twice the height of a fixture, and means forming an opening in the bottom of the back wall the width of the opening being substantially equal to the distance between the rails and the height of the opening being such that it is at least equal to a substantial portion of the height of a fixture.

7. A magazine for a plurality of fixtures, the outer surfaces of the fixture substantially defining a first rectangular parallelpiped, each of said fixtures having a top and a bottom surface, the distance between the top and bottom surfaces being the height of the fixture; said magazine comprising:

a hollow tube having a front, a back, and a pair of side rectangular walls; each of said walls having a substantially planar inner and outer surface, and a bottom, and a top surface;

a pair of ribs formed on the inner surfaces of each of said walls, said ribs being parallel to each other, spaced apart, and parallel to the intersection of the planes formed by the inner surfaces of the walls, each rib having a cross sectional area which is substantially a segment of a circle, the portions of each rib remote from the inner surface defining a rib plane, a pair of rails having substantially planar upper and lower surfaces which surfaces are substantially parallel to one another, the width of the rails being substantially less than one half the width of the outer surfaces of the front and rear walls and the length of the rails being slightly greater than the length of the outer surfaces of the side walls, each rail having a front end and a back end, one of said rails being fixedly secured to the bottom of one side wall and a part of the back wall, and the other of said rails being fixedly secured to the bottom of the other side wall and to a part of the back wall, so that the rails are substantially parallel to one another with their top and bottom surfaces being substantially parallel to one another and lying in the same planes, the back end of each rail projecting beyond the outer surfaces of the back wall to form a pair of back ledges; the front end of each rail extending beyond the inner surface of the front wall, the rib planes, a plane perpendicular to the rib planes near the top surfaces of the walls of said tubes, and the plane determined by top surface of the rails defining a second rectangular parallelpiped, the cross sectional area of which is slightly greater than the cross sectional area of the top surface of a fixture so that a plurality of such fixtures can be stacked one on top of the other within the hollow tubular member and so that said fixtures can be moved with a minimum of friction within the tube in a direction parallel to the ribs;

means forming a step in the upper portion of the front end of each rail, the remaining part of the front end of the step being a front ledge, means forming a first opening at the bottom of the front wall said first opening extending completely across the front wall and the height of the first opening from the top surface of the rails being at least equal to the height of a fixture and less than twice the height of the fixture; and means forming a second opening at the bottom of the back wall, the width of the second opening being not greater than the distance between the rails and the height of the second opening being at least a substantial part of the height of a fixture.

8. A magazine for a plurality of fixtures each fixture adapted to hold a segment of a film strip having a lead frame attached to the segment and an integrated circuit chip bonded to the lead frame; the outer surfaces of each fixture substantially defining a rectangular parallelipiped, the distance between a top and bottom faces of each parallelpiped being the height of a fixture and the top face of each fixture being substantially a square, said magazine comprising:

- a front wall, a back wall and a pair of side walls, said walls being fixedly secured together to form the body of the magazine, each of said walls having a substantially planar inner surface having a length and a width and defining a parallelpiped, and the side and back walls having substantially planar bottom surfaces,
- a pair of ribs formed on the inner surfaces of each wall of the tube said ribs being substantially parallel to the intersection of the inner surfaces of the walls of the tube;
- a cross section of the area of the space defined by planes substantially tangent to the ribs substantially forming a square slightly greater in area than that of the top faces of said fixtures;
- a pair of rails having substantially parallel upper and lower planar surfaces, the width of the rails being substantially less than one half of the width of the inner surface of the front wall and the length being greater than the width of a side wall, each of said rails having a front portion and a back portion, one of said rails being fixedly secured to the bottom surface of one side wall and to a part of the back wall adjacent to said one side wall, and the other rail being fixedly secured to the bottom surface of the other side wall and to a part of the back wall adjacent to said other side wall, and so that the rails are substantially parallel to each other, the back portion of each rail projecting substantially an equal distance beyond the back wall to form a pair of back ledges, and the front portion of each rail projecting beyond the inner surface of the front wall;
- means forming a rectangular opening in the bottom of the front wall, the height of the opening being greater than the height of a fixture and less than twice the height of a fixture and the width of the opening being at least equal to the width of the inner surface of the front wall;
- means forming a rectangular extractor opening in the bottom of the back wall, the height of the extractor opening being at least a substantial portion of the height of the fixture and its width being substantially equal to the distance between the rails;
- the front portion of the rails having means forming a step, the part of the front portion of each rail remaining forming a front ledge;
- and means forming a key slot in one of the front ledges.

* * * * *